(12) United States Patent
Fujita et al.

(10) Patent No.: US 8,198,926 B2
(45) Date of Patent: Jun. 12, 2012

(54) LOOP TYPE CLOCK ADJUSTMENT CIRCUIT AND TEST DEVICE

(75) Inventors: Kazuhiro Fujita, Tokyo (JP); Kazuhiro Yamamoto, Tokyo (JP); Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 1 day.

(21) Appl. No.: 12/936,680
(22) PCT Filed: Apr. 7, 2009
(86) PCT No.: PCT/JP2009/001605
§ 371 (c)(1),
(2), (4) Date: Dec. 14, 2010
(87) PCT Pub. No.: WO2009/125580
PCT Pub. Date: Oct. 15, 2009

(65) Prior Publication Data
US 2011/0089983 A1    Apr. 21, 2011

(30) Foreign Application Priority Data
Apr. 11, 2008  (JP) ................................ 2008-103584

(51) Int. Cl.
*H03L 7/06* (2006.01)
(52) U.S. Cl. ........................................ 327/156; 327/147
(58) Field of Classification Search .................. 327/147, 327/156
See application file for complete search history.

(56) References Cited

U.S. PATENT DOCUMENTS

| | | | | |
|---|---|---|---|---|
| 5,828,255 | A * | 10/1998 | Kelkar et al. | 327/157 |
| 7,053,683 | B2 * | 5/2006 | Li | 327/156 |
| 7,352,297 | B1 * | 4/2008 | Rylyakov et al. | 341/50 |

(Continued)

FOREIGN PATENT DOCUMENTS
JP    10-285038 A    10/1998
(Continued)

OTHER PUBLICATIONS

PCT International Search Report for PCT Application No. PCT/JP2009/001605 mailed on Jul. 14, 2009, with an English-language translation.

(Continued)

*Primary Examiner* — Lincoln Donovan
*Assistant Examiner* — Adam Houston
(74) *Attorney, Agent, or Firm* — Ladas & Parry, LLP (57) ABSTRACT

A variable delay circuit applies a variable delay that corresponds to an analog signal to a reference clock so as to generate a delayed clock. A phase detection unit detects the phase difference between the delayed clock and the reference clock, and generates a phase difference signal having a level that corresponds to the phase difference. A counter performs a counting up operation or a counting down operation according to the level of the phase difference signal. A digital/analog converter converts the count value of the counter into an analog signal, and supplies the count value thus converted to the variable delay circuit. The counter comprises: a first counter configured to use a first thermometer code to count the lower group of digits of the count value according to the phase difference signal; a second counter configured to use a second thermometer code to count an upper group of digits of the count value according to the phase difference signal; and a control circuit configured to perform a control operation such that the Hamming distance is maintained at 1 even in a carry operation and a borrow operation of the first counter and the second counter.

20 Claims, 7 Drawing Sheets

U.S. PATENT DOCUMENTS

| | | | |
|---|---|---|---|
| 7,940,097 B2 * | 5/2011 | Chen | 327/158 |
| 7,961,018 B2 * | 6/2011 | Hyun et al. | 327/158 |
| 2002/0079937 A1 * | 6/2002 | Xanthopoulos | 327/158 |
| 2003/0001639 A1 * | 1/2003 | Kim et al. | 327/160 |
| 2003/0206043 A1 * | 11/2003 | Chung | 327/156 |
| 2004/0196079 A1 * | 10/2004 | Chung | 327/156 |
| 2005/0264330 A1 * | 12/2005 | Li | 327/156 |
| 2006/0140022 A1 * | 6/2006 | Lee | 365/193 |
| 2007/0126484 A1 * | 6/2007 | Lin et al. | 327/156 |
| 2007/0146025 A1 * | 6/2007 | Huang et al. | 327/156 |
| 2008/0297208 A1 * | 12/2008 | Baudin et al. | 327/107 |
| 2010/0171527 A1 * | 7/2010 | Maeda | 327/7 |
| 2010/0289541 A1 * | 11/2010 | Wu | 327/158 |
| 2011/0089983 A1 * | 4/2011 | Fujita et al. | 327/159 |
| 2011/0128055 A1 * | 6/2011 | Pelgrom et al. | 327/156 |

FOREIGN PATENT DOCUMENTS

| | | |
|---|---|---|
| JP | 2001-118385 A | 4/2001 |
| JP | 2003-46388 A | 2/2003 |
| JP | 2003-69425 A | 3/2003 |
| WO | 2007/072731 A1 | 6/2007 |

OTHER PUBLICATIONS

PCT Written Opinion for PCT Application No. PCT/JP2009/001605 mailed on Jul. 14, 2009, with an English-language translation.

PCT International Preliminary Report on Patentability for PCT Application No. PCT/JP2009/001605 mailed on Nov. 30, 2010.

* cited by examiner

| | ODD Mode | | EVEN Mode | | | UP | ODD Mode | | EVEN Mode | |
|---|---|---|---|---|---|---|---|---|---|---|
| UP | Current | Next | Current | Next | | | Current | Next | Current | Next |
| 1 | #0000 | #0001 | #FFFF | #7FFF | | 0 | #FFFF | #7FFF | #0000 | #0001 |
| 1 | #0001 | #0003 | #7FFF | #3FFF | | 0 | #7FFF | #3FFF | #0001 | #0003 |
| 1 | #0003 | #0007 | #3FFF | #1FFF | | 0 | #3FFF | #1FFF | #0003 | #0007 |
| 《OMISSION》 | | | | | | 《OMISSION》 | | | | |
| 1 | #1FFF | #3FFF | #0007 | #0003 | | 0 | #0007 | #0003 | #1FFF | #3FFF |
| 1 | #3FFF | #7FFF | #0003 | #0001 | | 0 | #0003 | #0001 | #3FFF | #7FFF |
| 1 | #7FFF | #FFFF | #0001 | #0000 | | 0 | #0001 | #0000 | #7FFF | #FFFF |
| 1 | #FFFF (CY1) | #FFFF | #0000 (CY2) | #0000 | | 0 | #0000 (BL2) | #0000 | #FFFF (BL1) | #FFFF |

FIG.4

| CY1 | BL1 | HLD1 | CY2 | BL2 | HLD2 | Current | Next |
|---|---|---|---|---|---|---|---|
| 0 | 0 | 1 | 0 | 0 | 1 | QBn | QBn |
| 1 | 0 | 0 | 0 | 0 | 1 | QBn(Evn) | QBn(Evn)+1 |
| 1 | 0 | 0 | 0 | 0 | 1 | QBn(Odd) | QBn(Odd) |
| 0 | 0 | 1 | 1 | 0 | 0 | QBn(Evn) | QBn(Evn) |
| 0 | 0 | 1 | 1 | 0 | 0 | QBn(Odd) | QBn(Odd)+1 |
| 0 | 1 | 0 | 0 | 0 | 1 | QBn(Evn) | QBn(Evn) |
| 0 | 1 | 0 | 0 | 0 | 1 | QBn(Odd) | QBn(Odd)−1 |
| 0 | 0 | 1 | 0 | 1 | 0 | QBn(Evn) | QBn(Evn)−1 |
| 0 | 0 | 1 | 0 | 1 | 0 | QBn(Odd) | QBn(Odd) |
| 1 | 0 | 0 | 0 | 0 | 1 | #1FFFF | #1FFFF |
| 0 | 1 | 0 | 0 | 0 | 1 | #00000 | #00000 |

QBn(Evn)=#00001,#00007,#0001F,···,#07FFF,#1FFFF
QBn(Odd)=#00000,#00003,#0000F,···,#03FFF,#0FFFF

LOOP TYPE CLOCK ADJUSTMENT CIRCUIT AND TEST DEVICE

CROSS-REFERENCE TO RELATED APPLICATIONS

This application is the U.S. National Stage of International Patent Application No. PCT/JP2009/001605 filed on Apr. 7, 2009, which claims the priority to Japanese Patent Application No. 2008-103584 filed on Apr. 11, 2008, the disclosures of which are hereby incorporated by reference in their entirety.

BACKGROUND OF THE INVENTION

1. Field of the Invention

The present invention relates to a loop type clock adjustment circuit such as a DLL (Delay Locked Loop), PLL (Phase Locked Loop), etc., configured to adjust the phase or the frequency of a clock by making a comparison between the generated clock and a reference clock.

2. Description of the Related Art

A clock adjustment circuit such as a DLL, PLL, etc., includes a clock generating unit (clock adjustment unit) such as a variable delay circuit, a voltage controlled oscillator (which will be referred to as a "VCO" hereafter), or the like, a phase detection unit configured to detect the phase difference between the generated clock and a reference clock, and a loop control circuit configured to perform feedback control of the clock generating unit according to the phase difference.

The phase detection unit makes a comparison between the phases of the two clocks, and generates a phase difference signal that switches between high level and low level according to the phase difference. Specifically, the signal level switches according to the forward phase or the reverse phase.

Here, we consider an arrangement in which the loop control circuit has a configuration comprising: a counter configured to count up or count down according to the phase difference signal; and a digital/analog conversion circuit (DAC) configured to perform digital/analog conversion of the count value of the counter so as to control the clock generating unit.

In a case of employing a binary counter as such a counter, when a carry or a borrow occurs, in some cases, a transition with a large Hamming distance occurs. In a case in which a transition with a large Hamming distance occurs, multiple flip-flops included within the counter transit at the same time, leading to a problem of noise occurring in the counter. Furthermore, the value of each bit of the counter corresponds to the ON/OFF operation of the corresponding switch included in the DAC provided as a downstream component. In some cases, this leads to noise occurring in the DAC provided as a downstream component. For example, when the counter counts up and transits from the state [01111] to the state [10000] (states are represented as binary values), due to time lag that occurs in the transition operation of each switch, the counter temporarily transits from level 15 (=[01111]) to level 0 (=[00000]), following which the counter transits to level 16 (=[10000]). Alternatively, in some cases, the counter transits in the order level 15, level 31, level 16 ([01111], [11111], [10000]). This leads to a problem of noise being superimposed on the output of the DAC.

In order to solve such a problem, a method is conceived that employs a counter using a thermometer code. With such an arrangement, counting up and counting down are performed with a Hamming distance of 1 using the thermometer code. Thus, such an arrangement provides reduced switching noise as compared with an arrangement employing a binary counter. However, such an arrangement requires that the number of bits correspond to the maximum level of the count value. Accordingly, there is a need to provide data holding circuits such as flip-flops or latch circuits corresponding to the number of bits, leading to a problem of an increased circuit area.

SUMMARY OF THE INVENTION

The present invention has been made in order to solve such a problem. Accordingly, it is a general purpose of the present invention to provide a clock adjustment circuit which has an advantage of reduced noise without an increase in the circuit area.

An embodiment of the present invention relates to a loop type clock adjustment circuit. The loop type clock adjustment circuit comprises: a variable delay circuit configured to apply a variable delay that corresponds to an analog signal to a reference clock so as to generate a delayed clock; a phase detection unit configured to detect the phase difference between the delayed clock and the reference clock, and to generate a phase difference signal that corresponds to the phase difference; a counter configured to perform counting up or counting down according to the phase difference signal; and a digital/analog converter configured to convert the count value of the counter into an analog signal, and to supply the resulting analog signal to the variable delay circuit. The counter comprises: a first counter configured to count a lower group of digits of the count value using an m-bit (m represents an integer) first thermometer code according to the phase difference signal; a second counter configured to count an upper group of digits of the count value using an n-bit (n represents an integer) second thermometer code according to the phase difference signal; and a control circuit configured to perform a control operation such that a Hamming distance of 1 is maintained in the first counter and the second counter, including when performing a carry operation or a borrow operation.

Another embodiment of the present invention also relates to a loop type clock adjustment circuit. The loop type clock adjustment circuit comprises: a voltage controlled oscillator configured to generate a clock having a frequency that corresponds to an input control voltage; a phase detection unit configured to detect the phase difference between a clock generated by the voltage controlled oscillator and a reference clock, and to generate a phase difference signal that corresponds to the phase difference; a counter configured to perform a counting up operation and a counting down operation according to the phase difference signal received from the phase detection unit; and a digital/analog converter configured to convert the count value of the counter into an analog signal, and to supply, as the control voltage, the count value thus converted to the voltage controlled oscillator. The counter comprises: a first counter configured to count a lower group of digits of the count value using an m-bit (m represents an integer) first thermometer code according to the phase difference signal; a second counter configured to count an upper group of digits of the count value using an n-bit (n represents an integer) second thermometer code according to the phase difference signal; and a control circuit configured to perform a control operation such that the Hamming distance is maintained at 1 in the first counter and the second counter, including when performing a carry operation or a borrow operation.

By using the thermometer codes to perform counting up and counting down, such an embodiment maintains the Hamming distance at 1. Thus, such an arrangement reduces noise due to the switching operations of the transistors included within the counter.

It should be noted that the term "upper group of digits" represents a group of digits that is adjacent to the "lower group of digits". Thus, the "upper group of digits" does not necessarily need to include the most significant bit MSB. That is to say, the counter may include a counter configured to count a group of digits still higher than the "upper group of digits".

Also, the counter may hold the same count value for one count cycle when carrying from the first thermometer code to the second thermometer code.

In a case in which the carry operation and the transitions of the first thermometer code and the second thermometer code are performed at the same time, the operation of the counter is in danger of becoming unstable. By performing such a count value holding operation, such an embodiment provides the counter with a stable state transition.

Also, the counter may hold the same count value for one count cycle when borrowing from the second thermometer code to the first thermometer code.

In a case in which the borrow operation and the transitions of the first thermometer code and the second thermometer code are performed at the same time, the operation of the counter is in danger of becoming unstable. By performing such a count value holding operation, such an embodiment provides the counter with a stable state transition.

Also, the first counter may be capable of switching operation modes of the first thermometer code between a first mode in which positive logic counting is performed, and a second mode in which negative logic counting is performed.

By operating the first thermometer code in the two modes, such an arrangement provides a reduced Hamming distance when a carry or a borrow occurs in the first thermometer code. Furthermore, such an arrangement provides reduced noise.

Also, the first counter may switch operation modes between the first mode and the second mode according to whether the second thermometer code indicates an odd count value or an even count value.

Also, the digital/analog converter may be configured as a current summing digital/analog converter. Also, the digital/analog converter may comprise: m×n current sources each configured to generate a current that corresponds to one LSB (Least Significant Bit) of the count value, and configured such that their ON/OFF operations can be controlled independently; and a decoder configured to decode the first thermometer code and the second thermometer code so as to generate a control signal used to control the ON/OFF operation of each of the (m×n) current sources. Also, the decoder may comprise (m×n) logic gate groups provided in increments of the current sources. Also, the k-th ($k=i+(j-1) \times m$, $1 \leq i \leq m$, $1 \leq j \leq n$) logic gate group may perform a logic operation on at least the i-th bit of the first thermometer code and j-th bit of the second thermometer code so as to generate a control signal used to control the corresponding current source.

Also, in a case in which $j=1$, the k-th logic gate group may control the corresponding current source according to the logical OR of the i-th bit of the first thermometer code and the j-th bit of the second thermometer code. Also, in a case in which j is not equal to 1, when the (j−1)-th bit of the second thermometer code is asserted, the k-th logic gate group may control the corresponding current source according to the logical OR of the i-th bit of the first thermometer code and the j-th bit of the second thermometer code, and when the (j−1)-th bit of the second thermometer code is negated, the k-th logic gate group may turn off the corresponding current source.

Also, the k-th gate group may comprise a NAND gate and an OR gate. The NAND gate is configured to generate the logical NAND of data that corresponds to the i-th bit of the first thermometer code and data that corresponds to the (j−1)-th bit ($j \neq 1$) of the second thermometer code. The OR gate is configured to generate the logical OR of data that corresponds to the output of the NAND gate and data that corresponds to the j-th bit of the second thermometer code. Each of the NAND gates for which $j=1$ receives, as an input signal, a high-level signal instead of the (j−1)-th bit of the second thermometer code. Also, the k-th logic gate group may control the corresponding current source according to the output of the OR gate.

Also, the digital/analog converter may be configured as a current summing digital/analog converter. Also, the digital/analog converter may comprise: m×n current sources each configured to generate a current that corresponds to one LSB (Least Significant Bit) of the count value, and configured such that their ON/OFF operations can be controlled independently; and a decoder configured to decode the first thermometer code and the second thermometer code so as to generate a control signal used to control the ON/OFF operation of each of the (m×n) current sources. Also, each of the (m×n) current sources may comprise: a first transistor, a discharging transistor, a charging transistor, a first switch, and a second switch.

The discharging transistor is arranged between a control terminal of the first transistor and a fixed voltage terminal. The first switch is arranged such that a predetermined bias voltage is input via one terminal thereof, and the other terminal thereof is connected to the control terminal of the first transistor, and is configured to switch on and off according to the corresponding control signal. The discharging transistor and the second switch are arranged in series between the fixed voltage terminal and a bias line to which the bias voltage is to be applied. Also, the second switch may be turned on and off in phase with the first switch. Also, the discharging transistor and the charging transistor may be turned on and off in reverse phase to the first switch.

The bias circuit configured to generate a bias voltage has a significant output impedance. Accordingly, when the charging current is supplied to the gate capacitance in the step in which the first transistor is turned on, a voltage drop occurs in proportion to the charging current. This leads to fluctuation in the bias voltage that corresponds to the amount of the voltage drop, resulting in fluctuation in the current generated by the current source. With the embodiment, the charging transistors are provided, and thus, the current to be supplied from the bias circuit can be reduced. Thus, such an arrangement suppresses fluctuation in the bias voltage, thereby suppressing fluctuation in the current generated by the current source.

Yet another embodiment of the present invention relates to a test apparatus. The test apparatus comprises a loop type clock adjustment circuit. The test apparatus mounts a timing generator, a pattern generator, an interface circuit, etc. Such units each require a stable clock. By using the above-described clock adjustment circuit to generate such a clock, such an arrangement reduces noise that occurs in the test apparatus.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B.

Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
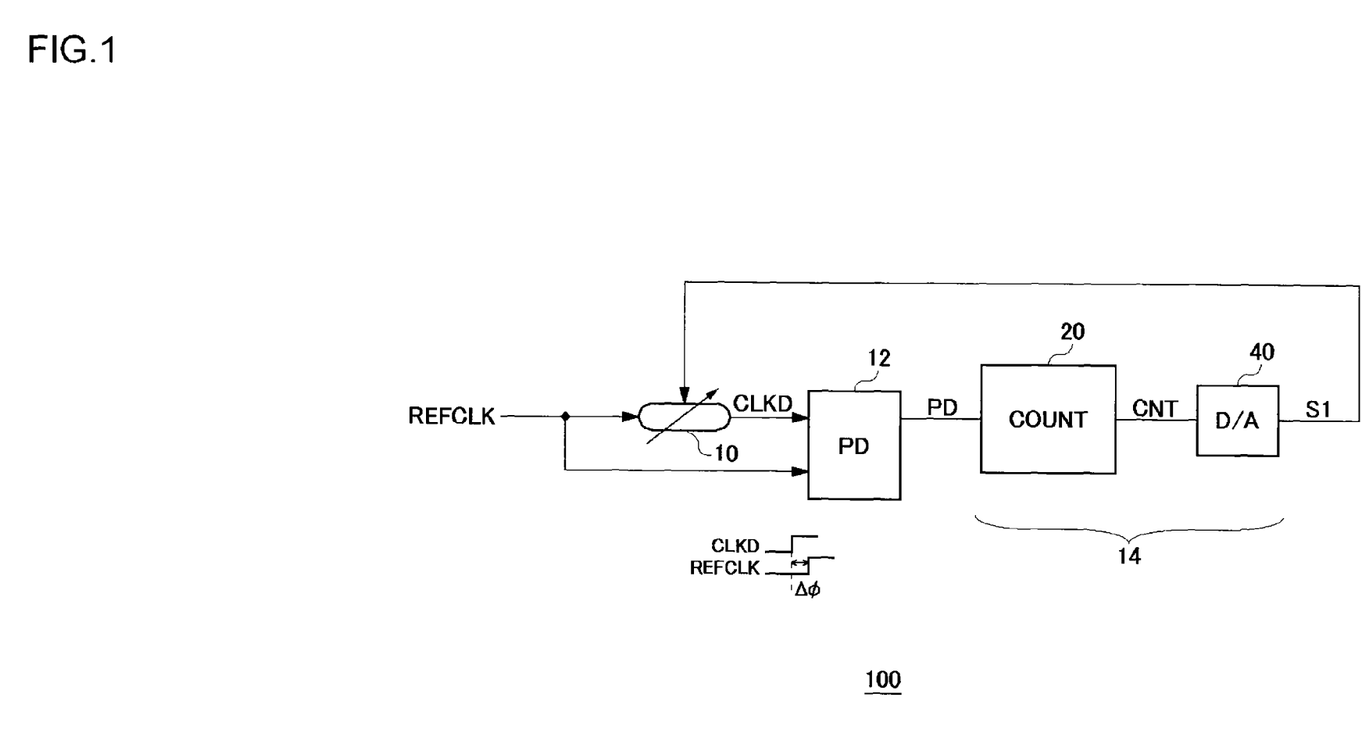
FIG. 1 is a circuit diagram which shows a configuration of a DLL according to an embodiment.

FIG. 1 is a circuit diagram which shows a configuration of a DLL 100 according to an embodiment. The DLL 100 includes a variable delay circuit 10, a phase detection unit 12, and a loop control circuit 14. The variable delay circuit 10 applies, to a reference clock REFCLK, a variable delay that corresponds to an input analog signal S1, thereby generating a delayed clock CLKD. For example, the variable delay circuit 10 includes inverters (buffers) connected in a multi-stage manner. Furthermore, the variable delay circuit 10 is configured such that the power supply voltage or the bias current to be applied to each inverter can be adjusted according to the analog signal S1. As a result, the delay amount is adjusted according to the analog signal S1.

The phase detection unit 12 detects the phase difference $\Delta\phi$ between the delayed clock CLKD and a reference clock REFCLK, and generates a phase difference signal PD having a level that corresponds to the phase difference.

When the phase difference $\Delta\phi$ is grater than a target value, the phase difference signal PD is set to the first level (e.g., high level), and when the phase difference $\Delta\phi$ is smaller than a target value, the phase difference signal PD is set to the second level (e.g., low level).

The loop control circuit 14 performs feedback control of the variable delay circuit 10 according to the phase difference signal PD which represents the phase difference $\Delta\phi$. The loop control circuit 14 includes a counter 20 and a DAC 40.

The counter 20 performs a counting up or a counting down count operation according to the level of the phase difference signal PD. The DAC 40 converts the count value CNT of the counter 20 into an analog signal S1, and supplies the resulting analog signal S1 to the variable delay circuit 10.

The above is the overall configuration of the DLL 100. A characteristic feature of the DLL 100 according to an embodiment is the loop control circuit 14. Detailed description will be made below regarding the configuration of the counter 20 and the DAC 40.

Figure 2:
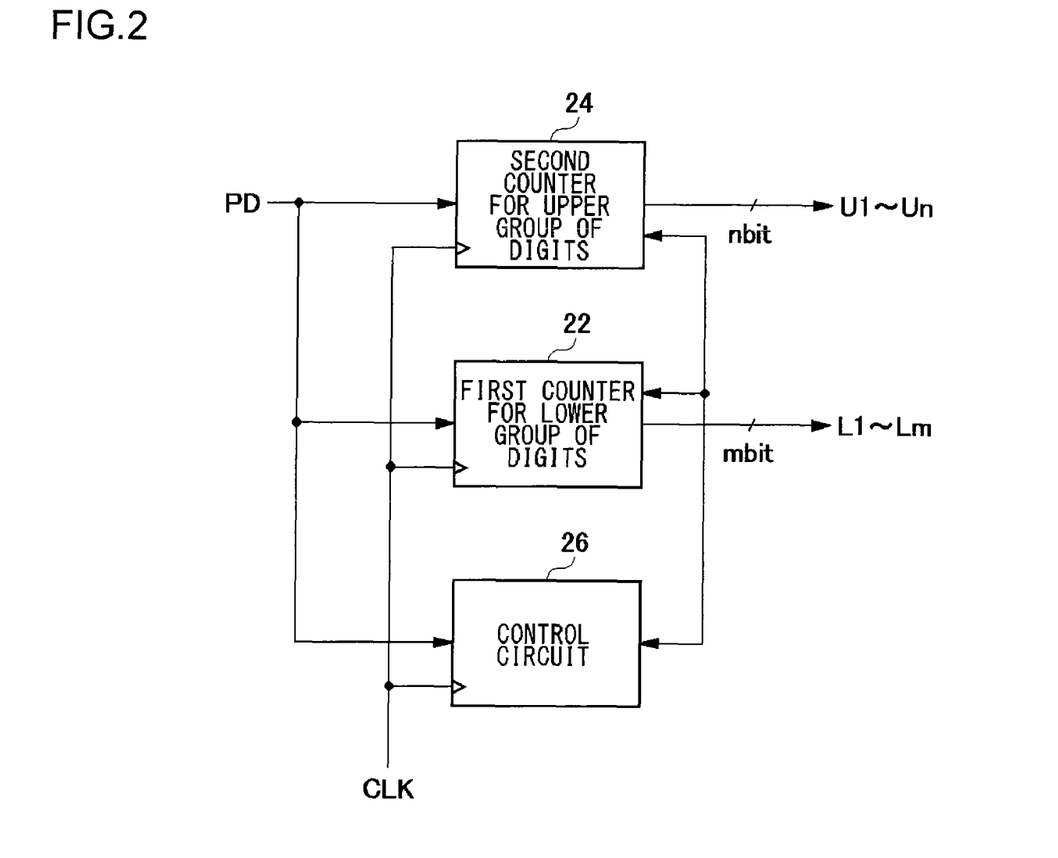
FIG. 2 is a block diagram which shows a configuration of a counter shown in FIG. 1.

FIG. 2 is a block diagram which shows a configuration of the counter 20 shown in FIG. 1. The counter 20 includes a first counter 22, a second counter 24, and a control circuit 26.

The counter 20 divides the count value CNT into multiple groups of digits, and counts using multiple counters provided in increments of the groups of digits. A counter configured to count a "lower group of digits" that includes at least the least significant bit LSB, and another counter configured to count an "upper group of digits" adjacent to the "lower group of digits", each perform a count operation using a thermometer code instead of a binary code. Although a thermometer code is preferably employed in a case in which there are digits higher than the aforementioned "upper group of digits", a binary code or other codes may also be used. For ease of understanding, description will be made regarding an arrangement in which the count value is divided into two groups of digits, i.e., an "upper group of digits" and a "lower group of digits". In this case, the "upper group of digits" includes the most significant bit MSB.

The first counter 22 uses an m-bit (m is an integer) first thermometer code TC1 to count the lower group of digits of the count value CNT according to the phase difference signal PD. The bits of the first thermometer code TC1, in order from the highest bit, are represented by $L_m, L_{m-1}, \ldots, L_1$. In a case in which a positive logic thermometer code is employed, the number of bits that are "1" represents the count value (which will be referred to as the "first count value CNT1" hereafter) of the first counter 22 as a decimal number. That is to say, when the first count value CNT1 is k ($0 \leq k \leq m$) as a decimal number, $L_m$ through $L_{k+1}$ are each 0, and $L_k$ through $L_1$ are each 1.

The second counter 24 uses an n-bit (n is an integer) second thermometer code TC2 to count the upper group of digits of the count value CNT according to the phase difference signal PD. The bits of the second thermometer code TC2, in order from the highest bit, are represented by $U_n, U_{n-1}, \ldots, U_1$. The second thermometer code TC2 is configured as a thermometer code for digits higher than the first thermometer code TC1. Thus, the bits $U_1$ through $U_1$ are each weighted by a decimal number m.

In a case in which a positive logic thermometer code is employed, when the count value (which will be referred to as the "second count value CNT2" hereafter) of the second counter 24 is 1 ($0 \leq l \leq n$) as a decimal number, $U_n$ through $U_{l+1}$ are each 0, and $U_l$ through $U_1$ are each 1.

The control circuit 26 controls the carry operation and the borrow operation performed between the first counter 22 and the second counter 24. Furthermore, the control circuit 26 controls the mode of the first counter 22 described later.

Next, description will be made regarding the operations of the first counter 22, the second counter 24, and the control circuit 26.

The first counter 22 receives the phase difference signal PD which indicates counting up or counting down, and performs counting up or counting down at a positive edge timing of the clock CLK. Such an arrangement is preferably configured such that the frequency of the clock CLK can be changed by means of a divider or the like. By providing such a variable frequency, such an arrangement is capable of controlling the loop gain of the DLL 100. For example, in order to generate the clock CLK, a variable frequency divider may be provided configured to divide a predetermined clock by a variable division ratio.

The first counter 22 is configured to operate in the following two modes, i.e., the first mode and the second mode.

In the first mode, the first counter 22 performs a positive logic count operation. In the second mode, the first counter 22 performs a negative logic count operation.

The mode of the first counter 22 is switched between the first mode and the second mode every time a carry occurs from the first thermometer code TC1 to the second thermometer code TC2, and every time a borrow occurs from the second thermometer code TC2 to the first thermometer code TC1.

Seen from another point of view, the operation mode of the first counter 22 is determined according to whether the second thermometer code TC2 indicates an odd number or an even number. Thus, the first mode will also be referred to as the "odd mode", and the second mode will also be referred to as the "even mode".

For example, in a case in which the first thermometer code TC1 is configured as a 4-bit thermometer code, when counting up is performed in the order 0, 1, 2, 3, 4, 5, 6, 7, 8, 9, and so on, as decimal numbers, the bit sequence is switched in the order (0000), (0001), (0011), (0111), (1111), (0111), (0011), (0001), (0000), and so on. That is to say, in the first mode, (0000) represents "0", and (1111) represents "4". In the second mode, (1111) represents "0", and (0000) represents "4".

Figure 3:
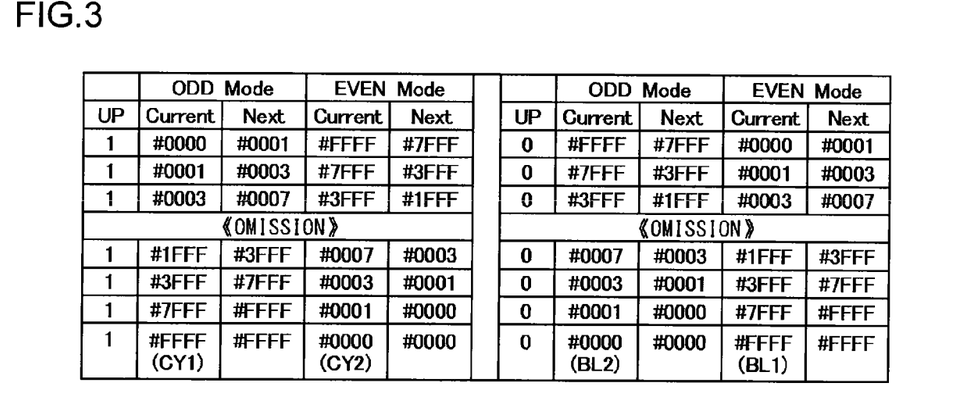
FIG. 3 is a state transition diagram for a first counter.

FIG. 3 is a state transition diagram showing the transition of the first counter 22. "ODD Mode" corresponds to the first mode, and "EVEN Mode" corresponds to the second mode. "UP" represents the phase difference signal PD. When "UP" is 1, counting up is indicated, and when "UP" is 0, counting down is indicated. The state transition diagram shown in FIG. 3 shows an arrangement in which the first thermometer code TC1 is configured as a 16-bit thermometer code. The bit sequences thereof are shown in hexadecimal. Specifically, in the positive logic first mode, the relations between the decimal coding, the thermometer coding, and the hexadecimal coding are as follows.

1=(0000000000000000)=0x0000
2=(0000000000000001)=0x0001
3=(0000000000000011)=0x0003
4=(0000000000000111)=0x0007
5=(0000000000001111)=0x000F
6=(0000000000011111)=0x003F
(omission)
11=(0000011111111111)=0x07FF
12=(0000111111111111)=0x0FFF
13=(0001111111111111)=0x1FFF
14=(0011111111111111)=0x3FFF
15=(0111111111111111)=0x7FFF
16=(1111111111111111)=0xFFFF In the second mode, the code obtained by logical inversion of the aforementioned truth table is applied to the decimal numbers 1 through 16.

In order to control carrying and borrowing between the first counter 22 and the second counter 24, the control circuit 26 controls the flags of a first carry bit CY1, a second carry bit CY2, a first borrow bit BL1, and a second borrow bit BL2.

In the counting up operation (UP=1), when the first thermometer code TC1 becomes 16 (=#FFFF) in the ODD mode, the flag of the first carry bit CY1 is asserted (CY1=1). On the other hand, when the first thermometer code TC1 becomes 16 (=#0000) in the EVEN mode, the flag of the second carry bit CY2 is asserted (CY2=1).

In the counting down operation (UP=0), when the first thermometer code TC1 becomes 0 (=#0000) in the ODD mode, the flag of the second borrow bit BL2 is asserted (BL2=1). On the other hand, when the first thermometer code TC1 becomes 0 (=#FFFF) in the ODD mode, the flag of the first borrow bit BL1 is asserted (BL1=1).

Furthermore, such an arrangement switches the mode between the ODD mode and the EVEN mode according to the up signal UP and the value of the first thermometer code TC1. The bit used to perform the switching operation is indicated by hatching in FIG. 3.

The first carry bit CY1 and the first borrow bit BL1 are used by the second counter 24 respectively to count up or count down an odd bit of the second thermometer code TC2. Furthermore, the second carry bit CY2 and the second borrow bit BL2 are used by the second counter 24 respectively to count up or count down an even bit of the second thermometer code TC2.

The above is the basic configuration of the counter 20. With the counter 20, the count value CNT is divided into the upper group of digits and the lower group of digits. Furthermore, the upper group of digits and the lower group of digits thus divided are counted by separate thermometer codes. Therefore, with attention to the counting up and the counting down performed in the lower group of digits, because the Hamming distance is 1, such an arrangement is capable of reducing noise that occurs in the counter 20 itself and the DAC 40 provided as a downstream component.

This effect can be clearly understood with reference to the following specific example. For example, in a case in which a binary counter is employed instead of such a thermometer code, when counting up from a count value of 7 to 8, the binary count value transits from (0111) to (1000). In this case, the Hamming distance is 4, which leads to an increase in the number of gate elements being switched in the counter 20, resulting in increased noise. In contrast, with the technique employing such a thermometer code, when counting up in the same situation, the thermometer code transits from (01111111) to (11111111). With such an arrangement, the Hamming distance is 1, which results in reduced noise.

On the other hand, in a case in which the count value of the counter 20 is not divided and a single thermometer code is used for counting, the Hamming distance always becomes 1, and such an arrangement is thus desirable from a noise perspective. However, if the same maximum count value is implemented in such an arrangement, this leads to a problem of an exponential increase in the number of bits required for the thermometer code. For example, in a case of implementing a counter having a maximum count value of 256, in an arrangement employing a binary counter, an 8-bit counter is sufficient. However, an arrangement employing a thermometer code requires a 256-bit counter.

The counter 20 according to the embodiment is advantageous from the perspective of the number of bits. For example, by dividing a count value with a maximum level of 256 into an upper group of digits and a lower group of digits, and by employing a 16-bit thermometer code to count each respective group, such an arrangement requires a total of only 32 bits. That is to say, in comparison with an arrangement employing a single thermometer code, such an arrangement reduces the required number of bits to ⅛.

The counter 20 is configured using sequential circuits such as flip-flops, latch circuits, etc. Accordingly, its circuit area increases in proportion to the number of output bits of the counter. With the counter 20 according to the embodiment, there is an increase in the number of flip-flops or latch circuits as compared with a binary counter. However, the counter 20 according to the embodiment has the advantage of a significantly reduced circuit area as compared with a case of full-bit counting by thermometer code.

As described above, it can be said that the counter 20 according to the embodiment has the advantages of a counter that uses a binary code, which is superior from the circuit area point of view, and of a counter that uses a single thermometer code, which is superior from the noise point of view.

Furthermore, with the counter 20 according to the embodiment, by means of the first counter 22 being configured to be switchable between the two operation modes, such an arrangement solves the following problem. If a count operation is performed only in the first mode (the positive logic mode), in such a case, the problem of the Hamming distance becoming large when carrying or borrowing occurs between the first thermometer code TC1 and the second thermometer code TC2 cannot be avoided. For example, in a case in which the 4-bit first thermometer code TC1 counts using only the first mode, when the count value transits from 4 to 5, the first thermometer code TC1 transits from (1111) to (0000) at the same time as a carry to the second thermometer code TC2 occurs. This leads to a problem of an increase in the Hamming distance. As the number of bits of the thermometer code TC1 increases, this problem becomes pronounced.

By using the counter 20 configured to switch between the first mode and the second mode, the Hamming distance is 1 even if carrying or borrowing occurs, and thus the aforementioned problem can be appropriately solved. For example, in a case in which the count value transits from 4 to 5, at the same time as carrying to the second thermometer code TC2 occurs, the first thermometer code TC1 transits from the positive logic (1111) to the negative logic (0111)#. The symbol "#" represents logical inversion. That is to say, because the Hamming distance is 1, noise reduction can be provided.

The noise that occurs in the counter 20 leads to jitter of the clock generated by the DLL 100. Thus, by reducing the noise that occurs in the counter 20, such an arrangement generates clock with reduced jitter.

The counter 20 has still more features for reducing noise. Description will be made below regarding these features.

When carrying from the first thermometer code TC1 to the second thermometer code TC2, the counter 20 holds the same count value for one count cycle. For example, in the case of a count operation of a 4-bit first thermometer code TC1, the count value CNT transits as in the order 1, 2, 3, 4, 4, 5, 6, 7, 8, 8, 9, 10, 11, 12, 12, 13, and so on.

When a carry operation and transitions of the first thermometer code and the second thermometer code are performed at the same time, the operation of the counter is in danger of becoming unstable. For example, in a case in which the count value is not held when the count value transits from 4 to 5, the counter transits from (0:1111) to (1:0111)#. However, if a time difference occurs between the transition of the first thermometer code and the transition of the second thermometer code in this step, in some cases, the counter transits in the order (0:1111) to (0:0111)# to (1:0111)#, that is, in the order 4, 1, 5. This leads to noise being superimposed on the output of the DAC. In contrast, with the embodiment, by holding the count value in such a step, the state transition is provided in a sure manner, thereby further reducing noise.

In the same way, when borrowing from the second thermometer code TC2 to the first thermometer code TC1, the counter 20 holds the same count value for one count cycle. For example, in a case of counting down by a 4-bit first thermometer code TC1, the count value CNT transits as in the order 13, 12, 12, 11, 10, 9, 8, 8, 7, 6, 5, 4, 4, 3, 2, 1, 0.

Also, when transitions of the first thermometer code and the second thermometer code are performed at the same time in the borrow operation, the operation of the counter is in danger of becoming unstable, resulting in noise being superimposed on the output of the DAC. In contrast, with the embodiment, the count value is held in such a step, thereby suppressing noise.

In other words, when carrying or borrowing occurs, such an arrangement performs only mode switching between the first mode and the second mode. That is to say, such an arrangement neither counts up nor counts down, and the state is held for one count cycle (which will be referred to as the "hold operation").

In order to perform the hold operation, the control circuit 26 controls a first hold bit HLD1 and a second hold bit HLD2.

When both the first carry bit CY1 and the first borrow bit BL1 are set to "0", the first hold bit HLD1 is set to "1". The first hold bit HLD1 is used together with the first carry bit CY1 and the first borrow bit BL1 in the count down, count up, and hold operations for the odd-numbered bits of the thermometer code TC2.

Furthermore, when both the second carry bit CY2 and the second borrow bit BL2 are set to "0", the second hold bit HLD2 is set to "1". The second hold bit HLD2 is used together with the second carry bit CY2 and the second borrow bit BL2 in the counting down operation, the counting up operation, and the hold operation for the second thermometer code TC2.

Figure 4:
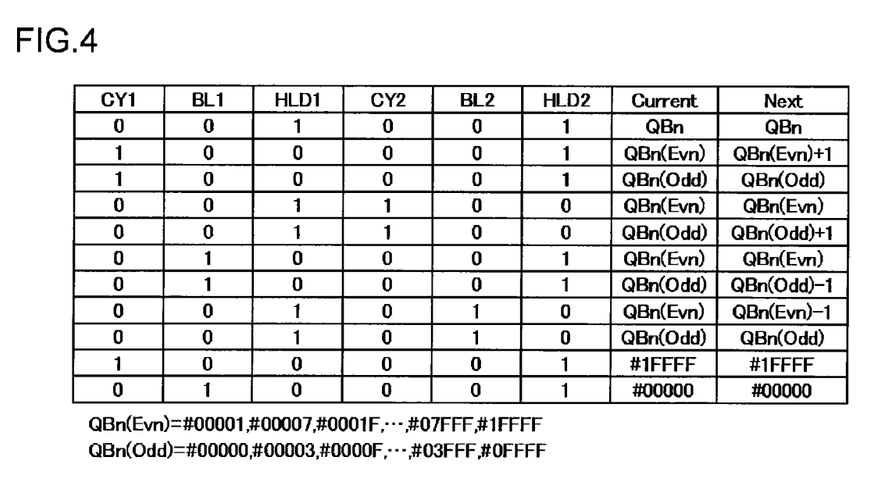
FIG. 4 is a state transition diagram for a second counter.

FIG. 4 is a state transition diagram for the second counter 24. The second counter 24 receives the control bits CY1, BL1, and HLD1, from the first counter 22, and counts up, counts down, or holds an odd bit of the second thermometer code TC2 using a positive edge of the clock CLK. Furthermore, the second counter 24 receives the control bits CY2, BL2, and HLD2 from the first counter 22, and counts up, counts down, or holds an even bit of the second thermometer code TC2 using a positive edge of the clock CLK.

By performing the hold operation, in such an arrangement, the upper second thermometer code TC2 and the lower first thermometer code TC1 are prevented from transiting at the same time. In a case in which the hold operation is not performed, when counting up the count value CNT from 4 to 5, transition occurs from (00:1111) to (01:0111), and the second thermometer code TC2 and the first thermometer code TC1 transit at the same time. Here, the count value CNT is represented as "(TC2:TC1)". The symbol represents the boundary between the first thermometer code TC1 and the second thermometer code TC2. When the lower first thermometer code TC1 is logically inverted, the bits to be supplied to the DAC 40 are inverted using a signal input to a NAND gate shown in FIG. 5 described later. If skew occurs between the timing of the bit inversion and the timing of the transition of the first thermometer code TC1 and the second thermometer code TC2, switching noise occurs in the DAC 40 provided as a downstream component.

The above is the configuration and the operation of the counter 20. Several characteristic features of the DLL 100 are in the DAC 40 provided as a downstream component of the counter 20. Description will be made below regarding the DAC 40.

Figure 5:
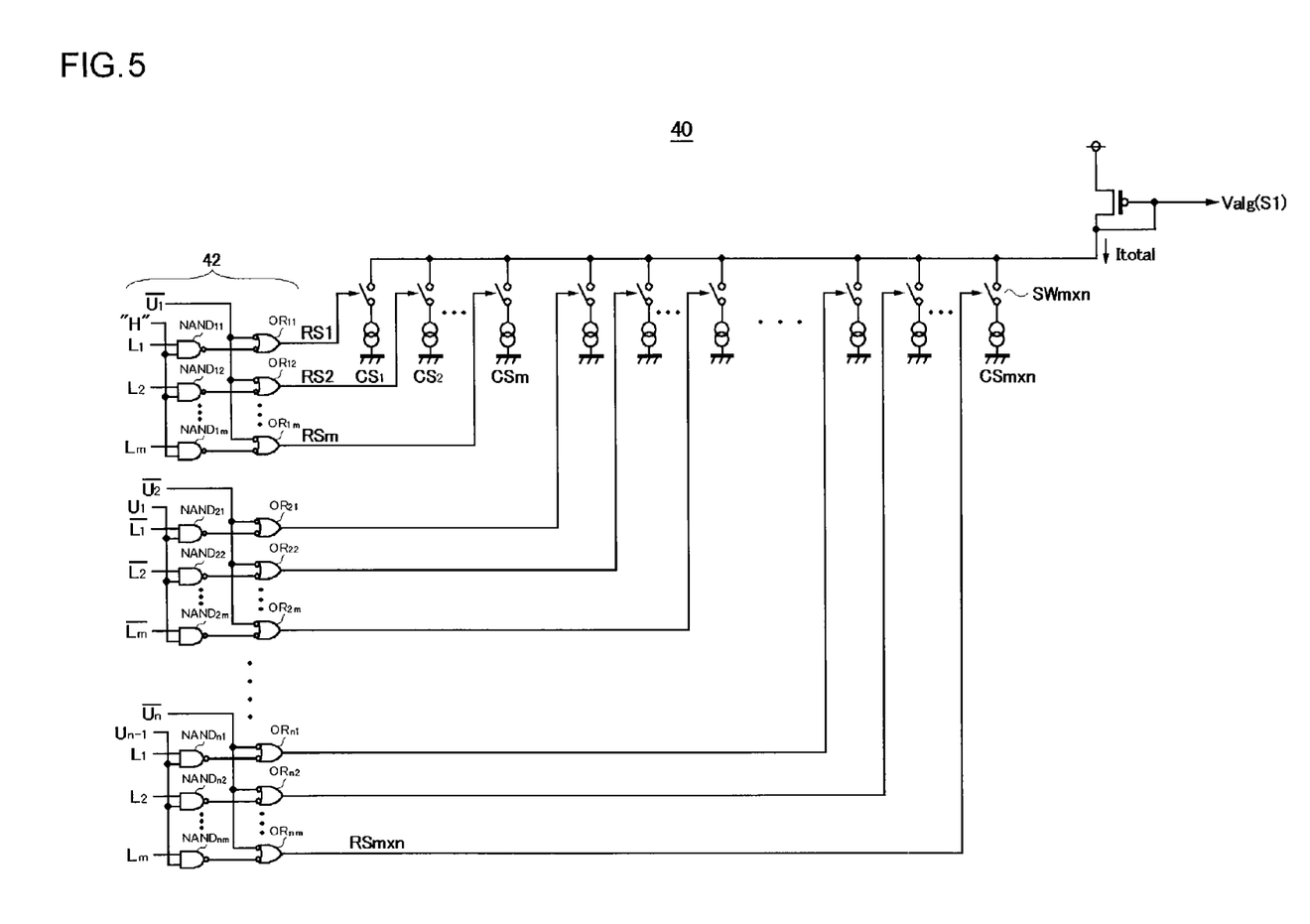
FIG. 5 is a circuit diagram which shows a configuration of a DAC.

FIG. 5 is a circuit diagram which shows a configuration of the DAC 40. The DAC 40 includes a decoder 42 and multiple current sources $CS_1$ through $CS_{m \times n}$ (which will collectively be referred to simply as the "CS"). The DAC 40 is a so-called current summing DAC. The multiple current sources $CS_1$ through $CS_{m \times n}$ each generate a current Ic that corresponds to one LSB of the count value obtained via the counter 20 provided as an upstream component. Multiple switches $SW_1$ through $SW_{m \times n}$, the ON/OFF operations of which are independently controllable according to respective control signals $RS_1$ through $RS_{m \times n}$, are respectively provided to the corresponding current sources CS1 through $CS_{m \times n}$. When the i-th switch $SW_1$ is turned on, the current generated by the i-th current source $CS_i$ is added. It should be noted that the configuration and the mounting position of each switch SW are not restricted in particular. Rather, any arrangement may be made that is capable of switching on and off the current Ic. The summed current Itotal is proportional to the count value CNT of the counter 20.

The decoder 42 receives the first thermometer code TC1 and the second thermometer code TC2, and decodes the thermometer codes thus received to the control signals $RS_1$ through $RS_{m \times n}$.

The decoder 42 includes m×n logic gate groups provided in increments of the current sources $CS_1$ through $CS_{m \times n}$. The k-th ($k=i+(j-1) \times m$, $1 \leq i \leq m$, $1 \leq j \leq n$) logic gate group performs logic operations on the i-th bit $L_i$ of the first thermometer code TC1 and the j-th bit $U_j$ of the second thermometer code TC2 so as to generate the control signal $RS_k$ to be used to control the corresponding k-th current source $CS_k$. That is to say, the logic gate groups are arranged in a matrix corresponding to the bits of the first thermometer code TC1 and the second thermometer code TC2.

Specifically, the m×n logic gate groups each include a negative logic input OR gate and a NAND gate. The k-th logic gate group includes the OR gate $OR_{ji}$ and the NAND gate $NAND_{ji}$. The OR gate $OR_{ji}$ receives, via the two inverting input terminals, the output signal of the NAND gate $NAND_{ji}$ and the signal $\#U_j$ which is obtained by logical inversion of the j-th bit $U_j$ of the second thermometer code TC2.

In a case in which j is an odd number, the NAND gate $NAND_{ji}$ receives, via its two respective input terminals, the i-th bit $L_i$ of the first thermometer code TC1 and the (j−1)-th bit of the second thermometer code TC2. In a case in which j=1, the NAND gate $NAND_{1i}$ receives, via its two respective input terminals, the i-th bit $L_i$ of the first thermometer code TC1 and a high-level signal (i.e., "1").

In a case in which j is an even number, the NAND gate $NAND_{ji}$ receives, via the two input terminals thereof, the inverted signal $\#L_i$ of the i-th bit $L_i$ of the first thermometer code TC1 and the (j−1)-th bit $U_{j-1}$ of the second thermometer code TC2.

Description will be made regarding the operation of the decoder 42 shown in FIG. 6 having such a configuration.

Directing attention to the operation of the logic gate group configured to control the k-th current source $CS_k$, the bit $U_{j-1}$, which is one bit lower than $U_j$, and which is input to the NAND gate $NAND_{ji}$, functions as an enable signal for the logic gate group.

When the bit $U_{j-1}$, which is one lower than the bit $U_j$ of the second thermometer code TC2, is 1, the NAND gate $NAND_{ji}$ outputs a bit signal obtained by logical inversion of the i-th bit $L_i$ (or $\#L_i$) of the first thermometer code TC1. In this case, the negative logic input OR gate $OR_{ji}$ outputs a signal obtained by taking the logical OR of the i-th bit $L_i/\#L_i$ of the first thermometer code TC1 and the j-th bit $U_j$ of the second thermometer code TC2.

It should be noted that "H" is input to each of the NAND gates $NAND_{11}$ through $NAND_{1m}$, and accordingly, the NAND gates $NAND_{11}$ through $NAND_{1m}$ are always in the enable state. In this case, the output of the negative logic input OR gate $OR_{ji}$ is obtained by taking the logical OR of the i-th bit $L_i$ of the first thermometer code TC1 and the first bit $U_j$ of the second thermometer code TC2.

When the $U_{j-1}$, which is one bit lower than $U_j$, is 0, the NAND gate $NAND_{ji}$ outputs "1". In this case, the output of the negative logic input OR gate $OR_{ji}$ is 0, which turns off the current source CSk.

For example, when the lower bits $L_1$ through $L_m$ of the $U_{j-1}$ gate group have been counted, all these bits become "1", and "1" is input to the NAND gate $NAND_{j1}$ through $NAND_{jm}$ of the $U_j$ gate group which is one higher than the $U_{j-1}$ gate group. As a result, the $U_j$ gate group becomes able to count. In other words, the sum total of the gate groups $U_2$ through $U_n$ amounts to (n−1)×m (m is a weighting factor of m counts). Furthermore, "H" is input to the NANDs of the $U_1$ gate group. Accordingly, the weighting factor m provided by the $U_1$ gate group is added, thereby enabling counting up to (n−1)×m+m=n×m.

With the aforementioned decoder 42, the first thermometer code TC1 and the second thermometer code TC2 are appropriately decoded, thereby controlling the corresponding current sources CS in a sure manner. It should be noted that the AND gates, OR gates, NAND gates, NOR gates, etc., may be mutually substituted by inverting the logical level of the signals, which is encompassed in the scope of the present invention.

Figure 6:
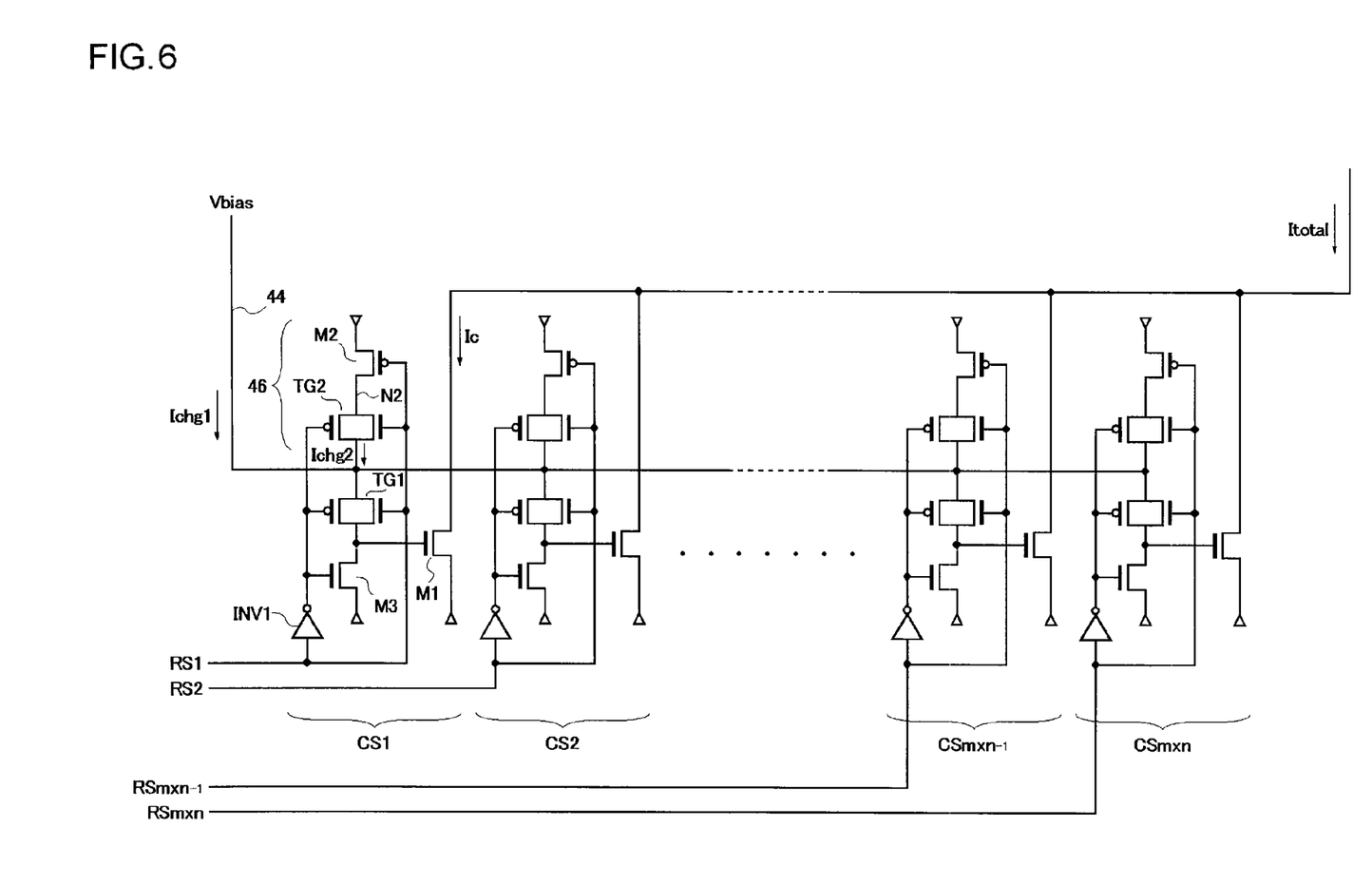
FIG. 6 is a circuit diagram which shows multiple current sources.

FIG. 6 is a circuit diagram which shows multiple current sources $CS_1$ through $CS_{m \times n}$. These current sources have the same configuration. Thus, description will be made regarding the configuration of the first current source CS1 as a model.

The current source CS1 includes a first transistor M1, a first transfer gate TG1, a second transfer gate TG2, a charging transistor M2, a discharging transistor M3, and an inverter INV1. The first transistor M1 is configured as an N-channel MOSFET (Metal Oxide Semiconductor Field Effect Transistor), and is arranged such that the source thereof is grounded.

The first transfer gate TG1 functions as a first switch, and is arranged such that a predetermined bias voltage Vbias is input to one terminal thereof, and the other terminal thereof is connected to the control terminal (gate) of the first transistor M1. The first transfer gate TG1 switches on and off according to the corresponding control signal $RS_1$. When the control signal $RS_1$ is set to high level, the first transfer gate TG1 is turned on. In this state, the bias voltage Vbias is supplied to the gate of the first transistor M1, and a drain current Ic flows according to the bias voltage Vbias.

The discharging transistor M3 is arranged between the gate of the first transistor M1 and the fixed voltage terminal (ground terminal). The discharging transistor M3 is configured to switch on and off in a manner complementary to the first transfer gate TG1. Specifically, the control signal $RS_1$ is inverted by the inverter INV1, and the inverted control signal is supplied to the control terminal (gate) of the discharging transistor M3. By providing the discharging transistor M3, such an arrangement is capable of discharging the gate capacitance of the first transistor M1 at high speed when the current source $CS_1$ is turned off according to the low level of the control signal $RS_1$, thereby allowing the first transistor M1 to be immediately turned off.

Here, directing attention to the switching speed of the first transistor M1, when the control signal $RS_1$ is in the low level state, the first transfer gate TG1 is turned off. In this state, the bias voltage Vbias is not supplied to the gate of the first transistor M1, and accordingly, the current Ic does not flow.

Subsequently, when the control signal $RS_1$ transits to high level, the first transfer gate TG1 switches on, and the bias voltage Vbias is supplied to the gate of the first transistor M1. Before the gate voltage of the first transistor M1, which dropped to the vicinity of the ground potential after the first transistor M1 was turned off, rises to the bias voltage Vbias, there is a need to charge the gate capacitance of the first transistor M1 using the charging current Ichg1 supplied from an unshown bias circuit. However, such a bias circuit has a significant output impedance. Accordingly, the bias voltage Vbias drops due to a voltage drop that is proportional to the charging current Ichg1, which reduces the current Ic generated by the first transistor M1. With the current drop in this case as ΔIc, when the number of current sources CS that are on is n (n is an integer), a total current fluctuation of ΔIc×n occurs in the DAC 40.

In order to suppress this current fluctuation, an auxiliary charging circuit 46 is arranged in parallel with the bias circuit. The charging circuit 46 includes the second transfer gate TG2 and the charging transistor M2 arranged in series between a bias line 44 and a fixed voltage terminal (power supply terminal).

The charging transistor M2 is configured as a P-channel MOSFET, and is arranged such that the control signal RS1 is input to the gate thereof and the source thereof is connected to the power supply terminal. When the control signal RS1 is low level, the charging transistor M2 is turned on. That is to say, the charging transistor M2 switches on in reverse phase to the first transfer gate TG1.

The second transfer gate TG2 is arranged between the drain of the charging transistor M2 and the bias line 44. Furthermore, the control signal $RS_1$ is input to the second transfer gate TG2. The second transfer gate TG2 is switched on and off at the same timing as the first transfer gate TG1.

Description will be made regarding the operation of the DAC 40 including the charging circuit 46. In the state in which the control signal $RS_1$ is low level, the first transfer gate TG1 is off, and the discharging transistor M3 is on, which fixes the gate electric potential of the first transistor M1 in the vicinity of the ground electric potential. In this state, the charging transistor M2 is on, and accordingly, the electric potential at a node N2 between the charging transistor M2 and the second transfer gate TG2 is pulled up to the power supply voltage, and charge is stored in the capacitance thereof.

Subsequently, when the control signal $RS_1$ is switched to high level, the first transfer gate TG1 is turned on, and the gate capacitance of the first transistor M1 is charged using the charging current Ichg1 supplied from the bias circuit (not shown). Furthermore, at the same time, the second transfer gate TG2 is turned on, and accordingly, the charge stored at the connection node N2 flows, as an auxiliary charging current, to the gate of the first transistor M1 via the second transfer gate TG2 and the first transfer gate TG1. Thus, such an arrangement provides a reduced charging current Ichag1 to be supplied from the bias circuit as compared with an arrangement that does not include the charging circuit 46. Thus, such an arrangement reduces fluctuation in the bias voltage Vbias. As a result, such an arrangement suppresses fluctuation in the current Ic that flows to each first transistor M1, thereby reducing fluctuation in the total current Itotal that flows through the DAC 40.

Furthermore, as compared with an arrangement that does not include the charging circuit 46, by providing such an auxiliary charging current Ichg2, such an arrangement quickens the charging speed of the gate capacitance of the first transistor M1, and thus enables the first transistor M1 to be switched on at a high speed.

Description has been made regarding the DLL 100 according to the embodiment. Next, description will be made regarding an application thereof. The DLL 100 according to the embodiment can be suitably applied to a semiconductor test apparatus. The semiconductor test apparatus mounts a large number of units configured to operate using a clock, such as timing generators, pattern generators, serial interfaces, etc. By using the DLL 100 according to the embodiment to generate such a clock, such an arrangement is capable of suppressing noise that occurs in the DLL 100. Furthermore, such an arrangement is capable of generating a clock with little jitter.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Figure 7:
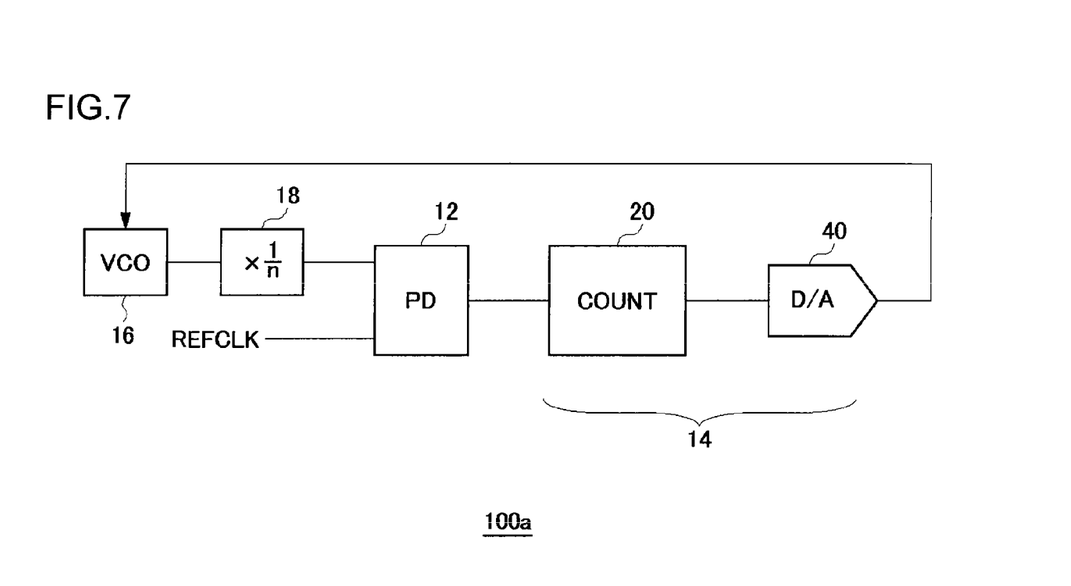
FIG. 7 is a block diagram which shows a configuration of a PLL according to an embodiment.

Although description has been made in the embodiment as an example regarding the DLL 100 which functions as a clock adjustment circuit, the present invention is also applicable to a PLL. FIG. 7 is a block diagram which shows a configuration of a PLL 100a according to an embodiment. The PLL 100a includes a VCO 16 and a divider 18, instead of the variable delay circuit 10 shown in FIG. 1.

The VCO 16 generates a clock CLK having a frequency that corresponds to an input control signal S1. The divider 18 divides the clock CLK. The phase detection unit 12 detects the phase difference between the clock CLK2 thus divided and a reference clock REFCLK. The operation of a loop control circuit 14 is the same as that in the DLL 100 shown in FIG. 1. The control voltage that corresponds to the analog signal S1 generated by a DAC 40 is input to the VCO 16.

By employing the loop control circuit 14 according to the embodiment in the PLL 100a, such an arrangement provides the above-described various advantages such as noise reduction, etc.

Description has been made as an example regarding an arrangement in which the transistors are each configured as a MOSFET. Also, such a transistor may be configured as a bipolar transistor. Also, the N-channel MOSFETs and the P-channel MOSFETs may be mutually substituted by reversing the power supply voltage and the ground voltage. Also, the circuit may be modified by insertion of resistors and the like. It is needless to say that such modifications are also encompassed in the scope of the present invention.

For example, although the current source CS shown in FIG. 6 is configured as a current sink (intake) type, the current source CS may also be configured as a current source (discharge) type by configuring the first transistor M1 as a P-channel MOSFET.

Description has been made in the embodiment regarding an arrangement in which the count value CNT is divided into an upper group of digits and a lower group of digits, and two thermometer codes are used to perform counting. However, the present invention is not restricted to such an arrangement. Also, counting may also be performed with the upper group of digits being further divided into multiple upper groups of digits. In order to provide the advantages of the present invention, the count value should be divided into multiple count values, and at least the lowest group of digits and the group of digits one higher than the lowest group of digits should be counted using respective thermometer codes.

By increasing the number of divisions of the thermometer code, such an arrangement reduces the total number of bits used for the multiple thermometer codes. For example, in a case in which counting is performed to the maximum level of 256, an arrangement in which a thermometer code is divided into an upper 16-bit thermometer and a lower 16-bit thermometer requires a counter with a total of 32 bits. However, in this case, an arrangement may be made in which two 8-bit thermometer codes and a single 4-bit thermometer code are employed, which requires only a 20-bit counter, thereby providing a reduced circuit area.

It should be noted that, in a case in which the counter is divided into three or more groups of digits, there is not necessarily a need to employ thermometer codes to count groups of digits three or more higher than the lowest group of digits. Rather, binary codes may also be employed.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A loop type clock adjustment circuit comprising:
a variable delay circuit configured to apply a variable delay that corresponds to an analog signal to a reference clock so as to generate a delayed clock;
a phase detection unit configured to detect the phase difference between the delayed clock and the reference clock, and to generate a phase difference signal that corresponds to the phase difference;
a counter configured to perform counting up or counting down according to the phase difference signal; and
a digital/analog converter configured to convert the count value of the counter into an analog signal, and to supply the resulting analog signal to the variable delay circuit,
wherein the counter comprises:
a first counter configured to count a lower group of digits of the count value using an m-bit (m represents an integer) first thermometer code according to the phase difference signal;
a second counter configured to count an upper group of digits of the count value using an n-bit (n represents an integer) second thermometer code according to the phase difference signal; and
a control circuit configured to perform a control operation such that a Hamming distance of 1 is maintained in the first counter and the second counter, including when performing a carry operation or a borrow operation.

2. A loop type clock adjustment circuit comprising:
a voltage controlled oscillator configured to generate a clock having a frequency that corresponds to an input control voltage;
a phase detection unit configured to detect the phase difference between a clock generated by the voltage controlled oscillator and a reference clock, and to generate a phase difference signal that corresponds to the phase difference;
a counter configured to perform a counting up operation and a counting down operation according to the phase difference signal received from the phase detection unit; and
a digital/analog converter configured to convert the count value of the counter into an analog signal, and to supply, as the control voltage, the count value thus converted to the voltage controlled oscillator,
wherein the counter comprises:
a first counter configured to count a lower group of digits of the count value using an m-bit (m represents an integer) first thermometer code according to the phase difference signal;
a second counter configured to count an upper group of digits of the count value using an n-bit (n represents an integer) second thermometer code according to the phase difference signal; and
a control circuit configured to perform a control operation such that the Hamming distance is maintained at 1 in the first counter and the second counter, including when performing a carry operation or a borrow operation.

3. A loop type clock adjustment circuit according to claim 1, or wherein the counter holds the same count value for one count cycle when carrying from the first thermometer code to the second thermometer code.

4. A loop type clock adjustment circuit according to claim 1, wherein the counter holds the same count value for one count cycle when borrowing from the second thermometer code to the first thermometer code.

5. A loop type clock adjustment circuit according to claim 1, wherein the first counter is capable of switching operation modes of the first thermometer code between a first mode in which positive logic counting is performed, and a second mode in which negative logic counting is performed.

6. A loop type clock adjustment circuit according to claim 5, wherein the first counter switches operation modes between the first mode and the second mode according to whether the second thermometer code indicates an odd count value or an even count value.

7. A loop type clock adjustment circuit according to claim 1, wherein the digital/analog converter is configured as a current summing digital/analog converter, and
wherein the digital/analog converter comprises:
m×n current sources each configured to generate a current that corresponds to one LSB (Least Significant Bit) of the count value, and configured such that their ON/OFF operations can be controlled independently; and
a decoder configured to decode the first thermometer code and the second thermometer code so as to generate a control signal used to control the ON/OFF operation of each of the (m×n) current sources,
and wherein the decoder comprises (m×n) logic gate groups provided in increments of the current sources,
and wherein the k-th ($k=i+(j-1)\times m$, $1 \leq i \leq m$, $1 \leq j \leq n$) logic gate group performs a logic operation on at least the i-th bit of the first thermometer code and j-th bit of the second thermometer code so as to generate a control signal used to control the corresponding current source.

8. A loop type clock adjustment circuit according to claim 7, wherein, in a case in which j=1, the k-th logic gate group controls the corresponding current source according to the logical OR of the i-th bit of the first thermometer code and the j-th bit of the second thermometer code,
and wherein, in a case in which j is not equal to 1, when the (j−1)-th bit of the second thermometer code is asserted, the k-th logic gate group controls the corresponding current source according to the logical OR of the i-th bit of the first thermometer code and the j-th bit of the second thermometer code, and when the (j−1)-th bit of the second thermometer code is negated, the k-th logic gate group turns off the corresponding current source.

9. A loop type clock adjustment circuit according to claim 8, wherein the k-th gate group comprises:
a NAND gate configured to generate the logical NAND of data that corresponds to the i-th bit of the first thermometer code and data that corresponds to the (j−1)-th bit (j≠1) of the second thermometer code; and
an OR gate configured to generate the logical OR of data that corresponds to the output of the NAND gate and data that corresponds to the j-th bit of the second thermometer code,
and wherein each of the NAND gates for which j=1 receives, as an input signal, a high-level signal instead of the (j−1)-th bit of the second thermometer code,
and wherein each current source is controlled according to the output of the corresponding OR gate.

10. A loop type clock adjustment circuit according to claim 1, wherein the digital/analog converter is configured as a current summing digital/analog converter, and
wherein the digital/analog converter comprises:
m×n current sources each configured to generate a current that corresponds to one LSB (Least Significant Bit) of the count value, and configured such that their ON/OFF operations can be controlled independently; and
a decoder configured to decode the first thermometer code and the second thermometer code so as to generate a control signal used to control the ON/OFF operation of each of the (m×n) current sources,
and wherein the (m×n) current sources each comprise:
a first transistor;
a discharging transistor arranged between a control terminal of the first transistor and a fixed voltage terminal;
a first switch arranged such that a predetermined bias voltage is input via one terminal thereof, and the other terminal thereof is connected to the control terminal of the first transistor, and which is configured to switch on and off according to the corresponding control signal; and
a discharging transistor and a second switch arranged in series between the fixed voltage terminal and a bias line to which the bias voltage is to be applied,
and wherein the second switch is turned on and off in phase with the first switch,
and wherein the discharging transistor and the charging transistor are turned on and off in reverse phase to the first switch.

11. A test apparatus comprising a loop type clock adjustment circuit the loop type clock adjustment circuit comprising:
a variable delay circuit configured to apply a variable delay that corresponds to an analog signal to a reference clock so as to generate a delayed clock;
a phase detection unit configured to detect the phase difference between the delayed clock and the reference clock, and to generate a phase difference signal that corresponds to the phase difference;
a counter configured to perform counting up or counting down according to the phase difference signal; and
a digital/analog converter configured to convert the count value of the counter into an analog signal, and to supply the resulting analog signal to the variable delay circuit,
wherein the counter comprises:
a first counter configured to count a lower group of digits of the count value using an m-bit (m represents an integer) first thermometer code according to the phase difference signal;
a second counter configured to count an upper group of digits of the count value using an n-bit (n represents an integer) second thermometer code according to the phase difference signal; and
a control circuit configured to perform a control operation such that a Hamming distance of 1 is maintained in the first counter and the second counter, including when performing a carry operation or a borrow operation.

12. A loop type clock adjustment circuit according to claim 2, wherein the counter holds the same count value for one count cycle when carrying from the first thermometer code to the second thermometer code.

13. A loop type clock adjustment circuit according to claim 2, wherein the counter holds the same count value for one count cycle when borrowing from the second thermometer code to the first thermometer code.

14. A loop type clock adjustment circuit according to claim 2, wherein the first counter is capable of switching operation modes of the first thermometer code between a first mode in which positive logic counting is performed, and a second mode in which negative logic counting is performed.

15. A loop type clock adjustment circuit according to claim 14, wherein the first counter switches operation modes between the first mode and the second mode according to whether the second thermometer code indicates an odd count value or an even count value.

16. A loop type clock adjustment circuit according to claim 2, wherein the digital/analog converter is configured as a current summing digital/analog converter, and
wherein the digital/analog converter comprises:
m×n current sources each configured to generate a current that corresponds to one LSB (Least Significant Bit) of the count value, and configured such that their ON/OFF operations can be controlled independently; and
a decoder configured to decode the first thermometer code and the second thermometer code so as to generate a control signal used to control the ON/OFF operation of each of the (m×n) current sources,
and wherein the decoder comprises (m×n) logic gate groups provided in increments of the current sources,
and wherein the k-th (k=i+(j−1)×m, 1≤i≤m, 1≤j≤n) logic gate group performs a logic operation on at least the i-th bit of the first thermometer code and j-th bit of the second thermometer code so as to generate a control signal used to control the corresponding current source.

17. A loop type clock adjustment circuit according to claim 16, wherein, in a case in which j=1, the k-th logic gate group controls the corresponding current source according to the logical OR of the i-th bit of the first thermometer code and the j-th bit of the second thermometer code,
and wherein, in a case in which j is not equal to 1, when the (j−1)-th bit of the second thermometer code is asserted, the k-th logic gate group controls the corresponding current source according to the logical OR of the i-th bit of the first thermometer code and the j-th bit of the second thermometer code, and when the (j−1)-th bit of the second thermometer code is negated, the k-th logic gate group turns off the corresponding current source.

18. A loop type clock adjustment circuit according to claim 17, wherein the k-th gate group comprises:
a NAND gate configured to generate the logical NAND of data that corresponds to the i-th bit of the first thermometer code and data that corresponds to the (j−1)-th bit (j≠1) of the second thermometer code; and
an OR gate configured to generate the logical OR of data that corresponds to the output of the NAND gate and data that corresponds to the j-th bit of the second thermometer code,
and wherein each of the NAND gates for which j=1 receives, as an input signal, a high-level signal instead of the (j−1)-th bit of the second thermometer code,
and wherein each current source is controlled according to the output of the corresponding OR gate.

19. A loop type clock adjustment circuit according to claim 2, wherein the digital/analog converter is configured as a current summing digital/analog converter, and
wherein the digital/analog converter comprises:
m×n current sources each configured to generate a current that corresponds to one LSB (Least Significant Bit) of the count value, and configured such that their ON/OFF operations can be controlled independently; and
a decoder configured to decode the first thermometer code and the second thermometer code so as to generate a control signal used to control the ON/OFF operation of each of the (m×n) current sources,
and wherein the (m×n) current sources each comprise:
a first transistor;
a discharging transistor arranged between a control terminal of the first transistor and a fixed voltage terminal;
a first switch arranged such that a predetermined bias voltage is input via one terminal thereof, and the other terminal thereof is connected to the control terminal of the first transistor, and which is configured to switch on and off according to the corresponding control signal; and
a discharging transistor and a second switch arranged in series between the fixed voltage terminal and a bias line to which the bias voltage is to be applied,
and wherein the second switch is turned on and off in phase with the first switch,
and wherein the discharging transistor and the charging transistor are turned on and off in reverse phase to the first switch.

20. A test apparatus comprising a loop type clock adjustment circuit, the loop type clock adjustment circuit comprising:
a voltage controlled oscillator configured to generate a clock having a frequency that corresponds to an input control voltage;
a phase detection unit configured to detect the phase difference between a clock generated by the voltage controlled oscillator and a reference clock, and to generate a phase difference signal that corresponds to the phase difference;
a counter configured to perform a counting up operation and a counting down operation according to the phase difference signal received from the phase detection unit; and
a digital/analog converter configured to convert the count value of the counter into an analog signal, and to supply, as the control voltage, the count value thus converted to the voltage controlled oscillator,
wherein the counter comprises:
a first counter configured to count a lower group of digits of the count value using an m-bit (m represents an integer) first thermometer code according to the phase difference signal;
a second counter configured to count an upper group of digits of the count value using an n-bit (n represents an integer) second thermometer code according to the phase difference signal; and
a control circuit configured to perform a control operation such that the Hamming distance is maintained at 1 in the first counter and the second counter, including when performing a carry operation or a borrow operation.

* * * * *